United States Patent
Ouchi

(10) Patent No.: US 8,759,771 B2
(45) Date of Patent: Jun. 24, 2014

(54) OPTICAL ELEMENT, AND OPTICAL DEVICE AND TERAHERTZ TIME-DOMAIN SPECTROSCOPIC APPARATUS INCLUDING THE SAME

(75) Inventor: Toshihiko Ouchi, Machida (JP)

(73) Assignee: Canon Kabushiki Kaisha, Tokyo (JP)

(*) Notice: Subject to any disclaimer, the term of this patent is extended or adjusted under 35 U.S.C. 154(b) by 229 days.

(21) Appl. No.: 13/031,014

(22) Filed: Feb. 18, 2011

(65) Prior Publication Data

US 2011/0215245 A1    Sep. 8, 2011

(30) Foreign Application Priority Data

Mar. 2, 2010 (JP) ................. 2010-044838

(51) Int. Cl.
*H01L 27/144* (2006.01)
(52) U.S. Cl.
CPC ................. *H01L 27/1443* (2013.01)
USPC .......... 250/338.4; 250/332; 250/370.01; 250/338.1; 257/432; 257/428; 257/98; 257/E33.068; 257/E31.127; 257/E27.127
(58) Field of Classification Search
CPC ....... G01J 3/42; H01L 27/144; H01L 31/023; H01L 33/58
USPC .............. 250/338.4, 332, 370.01, 338.1, 393; 257/428, 432, 98, E27.127
See application file for complete search history.

(56) References Cited

U.S. PATENT DOCUMENTS

| | | | |
|---|---|---|---|
| 2008/0135856 A1* | 6/2008 | Moon | 257/87 |
| 2008/0315098 A1* | 12/2008 | Itsuji | 250/330 |
| 2010/0013038 A1* | 1/2010 | Ouchi | 257/431 |
| 2010/0084570 A1* | 4/2010 | Katagiri | 250/458.1 |
| 2010/0147674 A1* | 6/2010 | Krivoshlykov | 204/157.4 |

FOREIGN PATENT DOCUMENTS

| | | |
|---|---|---|
| CN | 1993869 A | 7/2007 |
| CN | 101038211 A | 9/2007 |
| CN | 101063609 A | 10/2007 |
| JP | 2005-311324 A | 11/2005 |
| JP | 2006-086227 A | 3/2006 |
| JP | 2010045157 A | 2/2010 |

OTHER PUBLICATIONS

Tonouchi et al., "Performance of THz-TDS using 1.5 um femtosecond fiber laser with InP Schottky and DAST emitters" Optical Society of America, 2008, 2 pages.

* cited by examiner

*Primary Examiner* — David Porta
*Assistant Examiner* — Gisselle Gutierrez
(74) *Attorney, Agent, or Firm* — Canon U.S.A., Inc. IP Division

(57) ABSTRACT

An optical element includes a semiconductor layer having an energy band gap larger than a photon energy of light, and a plurality of electrodes in electrical contact with the semiconductor layer. At least one of the electrodes forms a Schottky junction between the electrode and the semiconductor layer; the Schottky junction has a barrier height smaller than the photon energy of the light. At least part of a junction surface between the electrode that forms the Schottky junction and the semiconductor layer includes a light irradiation surface arranged to be irradiated with the light from a surface of the semiconductor layer without the electrodes, and a portion of a coupling structure arranged to be coupled to a terahertz wave that is generated or detected through the irradiation with the light.

10 Claims, 6 Drawing Sheets

US 8,759,771 B2

OPTICAL ELEMENT, AND OPTICAL DEVICE AND TERAHERTZ TIME-DOMAIN SPECTROSCOPIC APPARATUS INCLUDING THE SAME

BACKGROUND OF THE INVENTION

1. Field of the Invention

The present invention relates to an optical element that generates or detects terahertz waves containing a component in a frequency domain from a millimeter wavelength band to a terahertz wavelength band (30 GHz to 30 THz), an optical device using the optical element, and an apparatus using the optical element. The present invention more particularly relates to an optical element that generates or detects electromagnetic wave pulses containing a Fourier component in the terahertz frequency band through optical pulse irradiation, an optical device using the optical element, and a terahertz time-domain spectroscopic apparatus (THz-TDS apparatus) using the optical element.

2. Description of the Related Art

In recent years, a nondestructive imaging technique using terahertz waves has been developed. The application of electromagnetic waves in the terahertz frequency band has proven to be a powerful technique that provides a perspective imaging apparatus much safer than an X-ray apparatus for performing imaging because terahertz waves have several advantages over x-rays. For example, terahertz waves have very low photon energies (e.g., 4 meV at 1 THz) which are about a million times lower than typical x-ray photon energies (e.g., in the range of keV). Therefore, terahertz waves do not subject a biological tissue to harmful radiation. Also, for example, a spectroscopic technique that determines a physical property of a substance, such as a binding state of molecules, by obtaining an absorption spectrum of the inside of the substance and a complex permittivity; and an analyzing technique for a biological molecule have been developed based on extraordinary noise rejection and extremely high signal-to-noise ratios of terahertz time-domain spectroscopy.

A widely known method for generating terahertz waves is a method of using a photoconductive element. The photoconductive element typically includes a special semiconductor and two electrodes arranged above the semiconductor. This special semiconductor is characterized by a relatively large mobility and a carrier lifetime duration of relatively few picoseconds or shorter. If a gap between the electrodes is irradiated with ultrashort pulsed light while a voltage is applied between the electrodes, excited photocarriers instantaneously carry electric current between the electrodes, and terahertz waves are radiated. The above-mentioned measurement and imaging technique are being studied while such a photoconductive element is also used as a detector for terahertz waves to provide THz-TDS. In the situations of the above techniques, a titanium-sapphire laser is typically used as an excitation source that generates ultrashort pulses of light at a center wavelength of 800 nm. However, to reduce the size and cost, it is desirable to use a fiber laser with a center wavelength in the communication waveband. In this case, the wavelength of the excited light is 1 μm or longer. A low-temperature growth (LT-)GaAs, which has been used for the photoconductive element, behaves as a transparent body for this wavelength. Hence, a GaAs cannot be used. Owing to this, a LT-InGaAs is being studied as a photoconductive material instead of GaAs (see Japanese Patent Laid-Open No. 2006-086227).

InGaAs, however, has a band gap smaller than GaAs, which means that the carrier concentration of an intrinsic semiconductor of this type may increase. Further, a remaining carrier concentration increases as a crystal defect increases. Hence, it is difficult to increase the resistance. Hence, an application voltage cannot be increased, and it is difficult to increase the amount of change in temporal differentiation for the number of photocarriers, as compared with GaAs. Owing to this, terahertz wave generation efficiency has been restricted. The restriction for the generation efficiency of terahertz waves is a considerable bottleneck for the development of the photoconductive element in the communication waveband. Hence, a new photoswitch system has been proposed. The proposed new system uses a Schottky junction without using photoconductivity. See 2008 Conference on Quantum Electronics and Laser Science, Conference on Lasers and Electro-Optics, CLEO/QELS 2008, Article number 4551244. With this system, a basic concept of which has been reproduced in FIG. 6, Schottky junction portions 72 arranged between a semi-insulating InP substrate 70 and Ti/Au electrodes 71 are irradiated with excitation light 73. Accordingly, electrons that obtain energy for crossing a Schottky barrier instantaneously move from the electrodes 71 to the InP substrate 70, and terahertz waves are generated. In this case, the excitation light 73 has a wavelength in a 1.5 μm band. The light is not absorbed by the InP substrate 70, but has a optical energy larger than the height of the Schottky barrier. Since the semi-insulating InP is used, the element has a resistance higher than the InGaAs type, and hence a higher electric field can be applied thereto. Accordingly, terahertz waves can be generated in a highly efficient manner.

However, with the Schottky type element described in 2008 Conference on Quantum Electronics and Laser Science Conference on Lasers and Electro-Optics, CLEO/QELS 2008, Article number 4551244, it is difficult to efficiently irradiate the interface between the electrodes and the semiconductor with the excitation light. This is because, referring to FIG. 6, basically the end portions 72 of the electrodes 71 and the semiconductor 70 are irradiated with the light 73 and only the Schottky junctions formed near the end portions are used as terahertz wave generation regions. That is, since the excitation light 73 is emitted from above the electrodes, the area of Schottky junction regions that are irradiated with the light becomes small, resulting in the generation efficiency of terahertz waves being restricted.

SUMMARY OF THE INVENTION

In light of the situations, the present invention provides an optical element configured to be irradiated with light and to generate or detect a terahertz wave in response thereof, and including the following configuration. The optical element according to an aspect of the present invention includes a semiconductor layer having an energy band gap larger than a photon energy of the light; and a plurality of electrodes formed in electrical contact with the semiconductor layer. At least one of the electrodes forms a Schottky junction between the electrode and the semiconductor layer, the Schottky junction having a barrier height smaller than the photon energy of the light. At least part of a junction surface between the electrode that forms the Schottky junction and the semiconductor layer includes a light irradiation surface arranged to be irradiated with the light from a surface of the semiconductor layer without the electrodes, and a portion of a coupling structure arranged to be coupled to the terahertz wave that is generated or detected through the irradiation with the light.

With this configuration, the junction surface that forms the Schottky junction is irradiated with the light from the semiconductor layer, and as a result the light irradiation region at the junction surface is expanded. Accordingly, the generation efficiency and detection efficiency of the terahertz wave can be increased.

Further features of the present invention will become apparent to persons having ordinary skill in the art from the following description of exemplary embodiments with reference to the attached drawings.

DESCRIPTION OF THE EMBODIMENTS

An optical element according to an embodiment is a Schottky type element. In a typical photoconductor element, an area between electrodes is irradiated with excitation light, and carriers are generated through interband transition. In contrast, in the case of the optical element according to the embodiment of the present invention, a junction surface between electrodes and a semiconductor layer, which is a photoconductive film, is irradiated with excitation light, to cause carriers of the electrodes to cross a barrier. Also, in the case of the Schottky type element of related art, the excitation light is emitted on an area near the junction surface between the electrodes and the photoconductive film from the upper side (electrode side). In contrast, in the case of the optical element according to the embodiment of the present invention, the excitation light is emitted from a surface without the electrodes of the semiconductor layer (from a plane surface or a side surface of the semiconductor layer without the electrodes). Accordingly, a light irradiation region at the junction surface is expanded. Also, the configuration portion of a coupling structure is formed near the light irradiation surface. Accordingly, terahertz waves are coupled to the coupling structure for efficient radiation or detection of the terahertz waves. Based on this premise, a basic structure of the optical element according to the embodiment of the present invention has the above configuration.

Embodiments and examples of the present invention will be described below with reference to the accompanying drawings.

First Embodiment

Figure 1A:
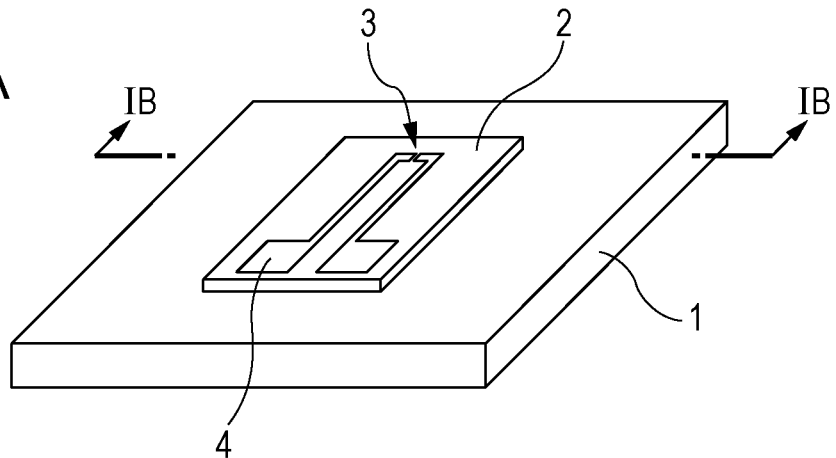
FIGS. 1A to 1C are structure diagrams showing an optical element according to a first embodiment of the present invention.
Figure 1B:
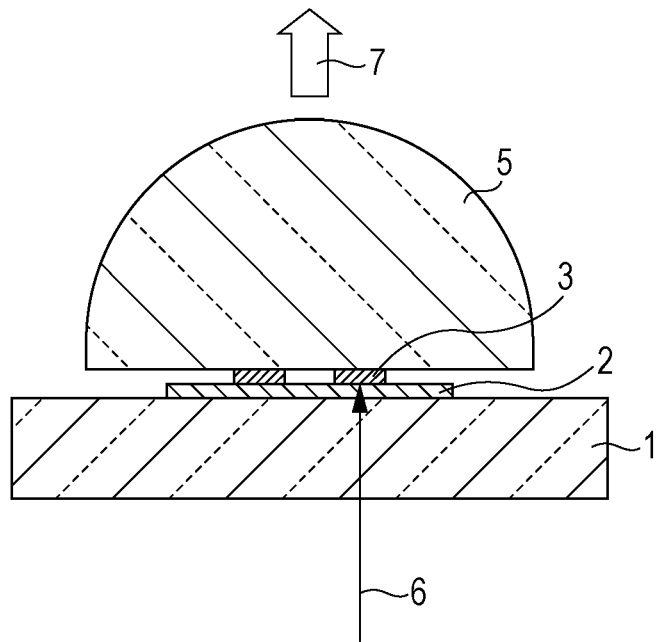

An optical element according to a first embodiment of the present invention is described with reference to a perspective view in FIG. 1A and a cross-sectional view in FIG. 1B taken along line IB-IB in FIG. 1A. This embodiment provides a structure that allows a junction surface between an electrode combined with antenna 3, which includes a plurality of electrodes including an electromagnetic wave coupling structure having a desirable frequency characteristic, and a semiconductor layer 2 to be irradiated with excitation light 6 from a substrate 1. Owing to this, the substrate 1 is not a substrate obtained when the semiconductor layer 2 is subjected to epitaxial growth, but is a substrate made of a material transparent to the irradiated excitation light 6 and having a small wavelength dispersion. The semiconductor layer 2 is transferred onto the substrate 1. That is, the semiconductor layer 2 is an epitaxial layer obtained by removing a growth substrate of an epitaxial layer and transferring the removed portion onto another substrate 1. A contact portion arranged between a metal and a semiconductor and forming a Schottky junction is provided by forming the electrode combined with antenna 3 on the semiconductor layer 2 having a band gap larger than a photon energy of the excitation light 6. The electrodes forming the Schottky junction serve as the electrode combined with antenna 3 including a light irradiation surface that is irradiated with the excitation light 6 and a coupling structure that is coupled to terahertz waves being generated therein. With this configuration, a transmissive region for the excitation light 6 before the light reaches the light irradiation surface includes a region of the semiconductor layer 2 and a region of the substrate 1 having a wavelength dispersion smaller than the wavelength dispersion of the semiconductor layer 2 in a wavelength band of the excitation light 6. In other words, the excitation light 6 reaches the light irradiation surface after transmitting through a region of the semiconductor layer 2 and a region of substrate 1 immediately below the light irradiation surface of electrode combined with antenna 3. The region of the substrate 1 has a wavelength dispersion smaller than the wavelength dispersion of the semiconductor layer 2 in the wavelength band of the excitation light 6. In this embodiment, the electromagnetic wave coupling structure is the electrode combined with antenna 3 including a gap portion for reradiation through coupling to the generated terahertz waves and having a desirable frequency characteristic. Alternatively, the electromagnetic wave coupling structure may be a typical coupling structure. In FIG. 1A, reference sign 4 denotes a conducting wire and pads for bias supply to the electrode combined with antenna 3.

Figure 2A:
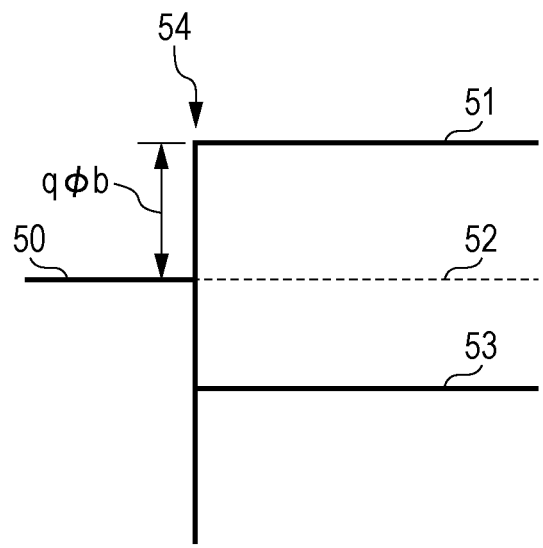
FIGS. 2A and 2B are illustrations explaining a Schottky junction.
Figure 2B:
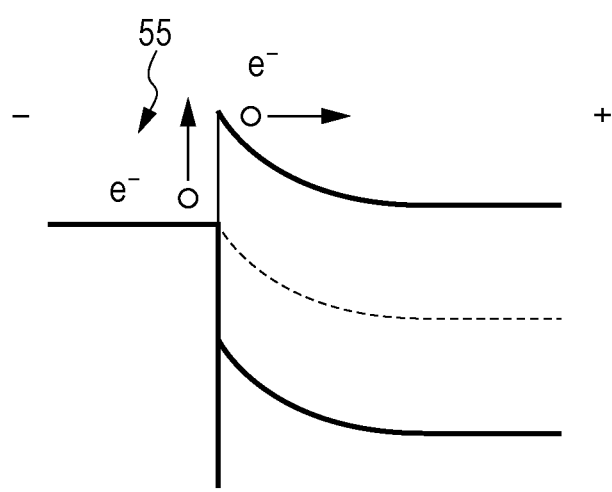

The principle for generation of terahertz waves will be described with reference to FIGS. 2A and 2B. FIG. 2A illustrates an energy band structure near a contact portion between a metal and a semiconductor. Reference sign 54 denotes a junction portion. The left side indicates a metal (in the above structure, the electrode combined with antenna 3), and the right side indicates a semiconductor (in the above structure, the semiconductor layer 2). Reference sign 50 is a Fermi level of the metal. By junction, the Fermi level 50 of the metal coincides with a Fermi level 52 of the semiconductor. In this explanation drawing, reference signs 51 and 53 respectively denote a conduction band and a valence band of the semiconductor. For example, this drawing illustrates a case in which the Fermi level is arranged substantially at the center because a semi-insulating semiconductor is used. Also, the drawing illustrates a case in which a work function $\Phi m$ of the metal coincides with a work function $\Phi s$ of the semiconductor, resulting in a flat band being formed. At this time, the conduction band 51 of the semiconductor is arranged at an energy position higher than the Fermi level 50 of the metal by $q(\Phi m-x)$ ($q$ is an elementary charge). The difference defines a Schottky barrier $q\Phi b$. Here, $x$ is an electron affinity of the semiconductor, and represents the amount of an energy difference between a vacuum level and the conduction band 51. The Schottky barrier is determined ideally in this way. However, pinning may actually occur depending on the surface condition, and hence Φb tends to become small. The Schottky barrier has to be obtained through actual measurement.

When the above-described configuration is biased by connecting an anode to the semiconductor and a cathode to the metal, electric current generally hardly flows due to the Schottky barrier. As shown in FIG. 2B, if an area near the Schottky junction is irradiated with light 55 having a photon energy larger than the barrier height qΦb, electrons that acquire the energy cross the barrier having an energy smaller than the photon energy of the light. In addition, the electrons are accelerated by the electric field applied to the semiconductor. If light irradiation is instantaneously performed at this time, instantaneous carrying current flows, a dipole varies, and hence electromagnetic waves in the terahertz band are generated. If the light irradiation is performed with optical pulses of the order of femtoseconds, electromagnetic wave pulses containing a Fourier frequency component in a terahertz band can be generated. The optical element differs from the aforementioned photoconductive element in that photoelectrons with the energy that crosses the Schottky barrier are used instead of photocarriers acquired through irradiation with light having a photon energy equal to or larger than the energy band gap of the semiconductor. Hence, the photon energy of the irradiation light 55 may be smaller than the band gap energy of the semiconductor layer, and in this case, the irradiation light 55 can be transmitted through the semiconductor layer. Also, the application of the electric field in the direction shown in FIG. 2B can maintain a high resistance. The high electric field can be applied until a breakdown occurs. In contrast, with the above-described InGaAs photoconductive element, since the resistance is low, electric current may increase before a breakdown occurs. Thus, the magnitude of the application voltage has been limited.

If electrons running through the semiconductor lose the energy because of, for example, scattering in the semiconductor, electromagnetic waves are no longer generated. Typically, electrons disappear if the optical pulses are with several hundred femtoseconds or shorter due to longitudinal optical phonon scattering. This value is sufficiently short for a typical semiconductor as compared with the lifetime of carriers that disappear at carrier recoupling. Thus, terahertz pulses can be generated. In the above-described configuration, the irradiation with the light 55 is applied to an electrode portion serving as an emitter for electrons from among the pair-of-electrode combined with antenna 3. That is, in this embodiment, the light irradiation surface is the electrode portion serving as the emitter. At this time, if a similar Schottky junction is formed at the other electrode portion (that is not irradiated with the light) of the electrode combined with antenna 3 with a gap portion arranged, since the condition of the other electrode portion is biased opposite to the condition shown in FIG. 2B, the conduction electrons of the semiconductor layer can be conducted to the other electrode portion. It is to be noted that a Schottky junction or an ohmic junction may be formed at the other electrode portion serving as a collector.

As described above, if the area near the Schottky junction portion is irradiated with ultrashort pulses of the order of femtoseconds, terahertz waves are generated. At this time, if a dipole antenna or the like is provided near the electromagnetic wave generating portion like a typical photoconductive element, generated terahertz waves 7 are temporarily coupled to the antenna, and then radiated in a direction as indicated by the upward pointing arrow in FIG. 1B. The generated terahertz waves have a directivity and a frequency characteristic depending on an antenna characteristic. To improve the radiation directivity, it is desirable to use a super hemispherical lens 5 made of high-resistance silicon as shown in FIG. 1B. However, the super hemispherical lens 5 may be omitted.

In the above description, the flat band type has been described. However, various cases may be conceived depending on combinations of a metal, a semiconductor material, and a conduction type. Therefore, if a Schottky barrier is formed, such various cases may be applied as modifications of this embodiment. For example, even with the same semiconductor material, if impurity doping is performed, the Fermi level can be changed and the work function can be changed. Accordingly, the form of the Schottky barrier can be appropriately designed. Also, if positive holes serve as carriers, the aforementioned anode and cathode may be switched. At this time, since a positive hole has an effective mass different from that of an electron, the energy band structure near the contact portion between the metal and the semiconductor has to be designed in accordance with the effective mass.

With this embodiment, the structure with the expanded light irradiation region at the Schottky junction portion can be provided. Terahertz waves can be generated or detected efficiently through the excitation with light. In particular, a terahertz wave generating and detecting element, which serves as an optical element effective for excitation light in a communication wavelength band of 1 μm or longer, a measurement apparatus using the element, and an imaging apparatus using the element can be provided. In this case, an excitation laser using fibers can serve as an irradiation unit, and hence the apparatus can be reduced in size and cost. Also, since it is not necessary to expand the light transmission region at the Schottky junction portion if light transmissivity is increased by reducing the thickness of the electrodes, a phenomenon in which an electrical resistance increases and the loss of terahertz waves increases can be prevented from occurring.

Example 1

Example 1 corresponding to the first embodiment will be described. This example has a configuration that is basically the same as the first embodiment. In this example, the configuration shown in FIG. 1A or 1B is provided. The substrate 1 may be made of a material being transparent to irradiated laser light and having a small wavelength dispersion. The material may be typically quartz, sapphire, or resin. A light-incident surface of the substrate 1 may be processed, for example, by nonreflective coating (not shown). The semiconductor layer 2 may use semi-insulating InP. The electrode combined with antenna 3 may be formed, for example, by vapor deposition with an Au/Ti film. With this combination of the materials, Au has a work function of about 5.1 eV, Ti has a work function of about 4.3 eV, and InP has an electron affinity of 4.4 eV. InP has an energy band gap of 1.35 eV. If the material is the semi-insulating material, the Fermi level thereof is at a position lower than the conduction band by $1.35/2 \approx 0.68$ eV, and the level substantially coincides with the Fermi level of Au. Hence, the flat band as shown in FIG. 2A can be formed. In fact, there is an actual measurement example in which the Schottky barrier between Au/Ti and InP has a height of about 0.5 eV. The conduction band of the Schottky junction portion curves. Even in this case, the transmissive region for the light 6 until (before) the light reaches the light irradiation surface includes the region of the semiconductor layer 2 and the region of the substrate 1 (e.g., quartz) having a wavelength dispersion smaller than the wavelength dispersion of the semiconductor layer 2 in the wavelength band of the light 6.

Figure 1C:
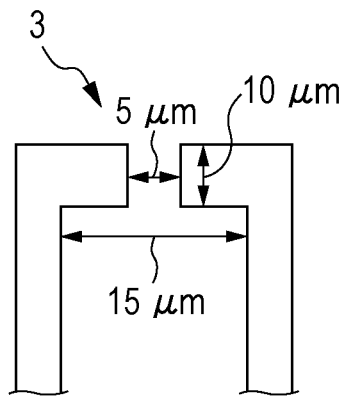

The height of the Schottky barrier is about 2.4 μm, and the wavelength of the light with a photon energy corresponding to the energy gap of InP is about 0.91 μm. For example, if a fiber-type femtosecond laser with a communication wavelength band of a 1.55 μm band is used, photoelectrons can be excited at the Schottky junction portion whereas the photoelectrons are not excited in the semiconductor layer 2. Thus, the use of such a femtosecond laser is suitable for reduction in size and cost of the system. In this example, the electrode combined with antenna 3 has an antenna shape with a gap of 5 μm, an antenna length of 15 μm, and a width of 10 μm as shown in FIG. 1C. However, the shape is not limited thereto. The semiconductor layer 2 of the semi-insulating InP film is formed by Fe doping and has a thickness of 1 μm. The InP film is provided on the substrate 1 by relocating an epitaxial film on an InP substrate with an InGaAs sacrificial layer arranged therebetween, by an epitaxial transfer technique. The film may be bonded to the holding substrate 1 such as quartz by direct joining or a method using an adhesive. After the semi-insulating InP substrate is joined to the holding substrate 1, if the thin film is left by polishing or the like, the semiconductor layer 2 may be formed without film deposition for the epitaxial layer.

If an ohmic junction is formed at the other electrode portion of the electrode combined with antenna 3, methods (not shown) are conceivable such that an impurity may be diffused in the electrode region, the electrode region may be changed to an alloy with use of an AuGe/Ni/Au electrode, or an n-InGaAs epitaxial layer may be provided selectively below the electrode. In FIG. 1A or 1B, the semiconductor layer 2 has a size smaller than the size of the substrate 1. However, these components may have the same shape, or the semiconductor layer 2 may be formed only in an area occupied by the antenna of the electrode combined with antenna 3.

If the substrate 1 is an InP substrate, since wavelength dispersion occurs, a desirably narrow pulse width may not be obtained even if the excitation light is incident on the substrate. In contrast, this example provides the structure suitable for the incidence of light from the substrate 1. A wide region at the junction surface, where the electrodes are in contact with the semiconductor and hence the Schottky junction is formed, can be irradiated with light. Therefore, terahertz pulses can be highly efficiently generated and detected. The other points are similar to those of the first embodiment.

Second Embodiment

Figure 3A:
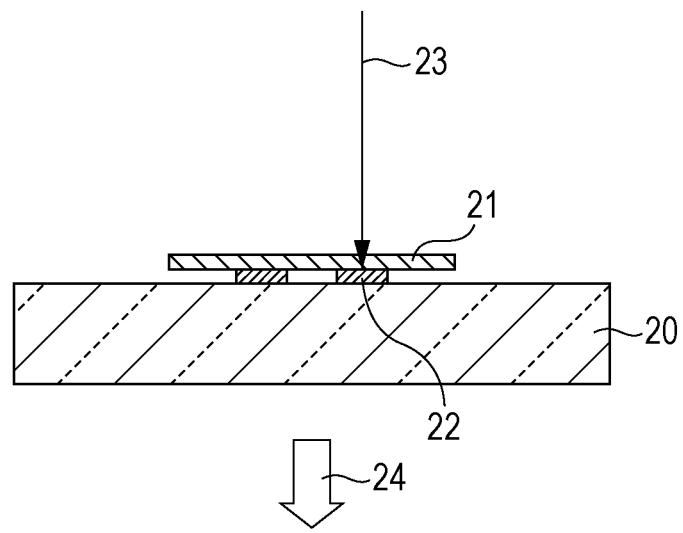
FIGS. 3A and 3B are structure diagrams showing optical elements according to second and third embodiments of the present invention.

A second embodiment of the present invention will be described. In this embodiment, referring to FIG. 3A, an electrode combined with antenna 22 is bonded to a holding substrate 20. A semiconductor that is used during epitaxial growth is removed from a semiconductor layer 21 and transferred on the holding substrate 20. If electrode wiring for biasing is formed on the surface of the holding substrate 20, the electrode combined with antenna 22 on the surface of the semiconductor layer 21 can be bonded to the holding substrate 20 such that the electrode combined with antenna 22 is brought into electrically contact with the electrode wiring. With this structure, high-resistance silicon, quartz, olefin, or resin such as olefin, Teflon (registered trademark), or polyethylene having good transmissivity for terahertz waves is suitable for the holding substrate 20. In this case, excitation laser light 23 is incident on the semiconductor layer 21 from the side without the electrodes (i.e., without the electrode combined with antenna 22). A similar material to the material in the first embodiment is used for the semiconductor layer 21, and terahertz pulses 24 are generated and radiated based on the same principle. The holding substrate 20 may have a lens shape or additionally include a lens to improve the directivity of the radiation of terahertz waves. In this embodiment, a transparent region to the excitation laser light 23 until the light reaches a light irradiation surface includes only the region of the semiconductor layer 21. That is, in order to reach the light irradiation surface, the excitation laser light 23 needs only go through the region of the semiconductor layer 21, which is transparent to the excitation laser light 23.

With this embodiment, the excitation light 23 is transmitted through only the thin semiconductor layer 21 and emitted on the Schottky junction portion without dispersion losses. The light that is not affected by dispersion and hence has a large band width can be emitted, and a band of terahertz waves can be expanded. The other points are similar to those of the first embodiment.

Third Embodiment

Figure 3B:
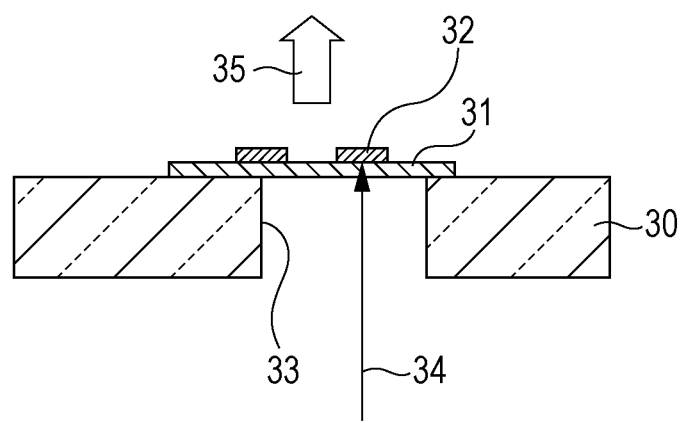

A third embodiment of the present invention will be described. In this embodiment, referring to FIG. 3B, a hole 33 is made at part of a holding substrate 30, so that excitation laser light 34 can be directly incident on a Schottky junction portion between an electrode combined with antenna 32 and a semiconductor layer 31 through the semiconductor layer 31. Accordingly, terahertz pulses 35 are generated and radiated. In this element, the substrate is only needed to be the holding substrate 30 with a hole. The substrate may be an insulating substrate or a substrate attached to the semiconductor layer 31 via an insulating layer. The material of the substrate 30 is not particularly limited. Hence, a substrate obtained when the semiconductor layer 31 is subjected to epitaxial growth can be directly used. In this embodiment, a transparent region to the excitation laser light 34 until the light reaches a light irradiation surface includes only the region of the semiconductor layer 31.

When a hole is made, controllability can be improved if an etching stop layer is provided between the semiconductor substrate and the semiconductor layer 31. For example, in the case of InP type, an etching stop layer of InGaAs or the like is used. This embodiment provides the structure in which the excitation laser light 34 and terahertz waves propagate in vacuum or in the air, but do not substantially pass through a substance. The light and terahertz waves are hardly affected by wavelength dispersion of the material. The other points are similar to those of the first embodiment.

Fourth Embodiment

A fourth embodiment of the present invention will be described. In this embodiment, referring to FIG. 4A or 4B, an electrode combined with antenna 42 and an electrode combined with antenna 43 serving as electrodes are formed on upper and lower surfaces of a semiconductor layer 41. The electrodes have a gap therebetween, the gap which is defined by a film thickness of the semiconductor layer 41. One electrode line 43 is provided on the surface of a holding substrate 40, the semiconductor layer 41 is transferred thereon like the first embodiment, and the other electrode line 42 also serving as an antenna is formed thereon. In this case, for example, the electrode line 42 extending in parallel to the electrode line 43 is designed so as to function as an antenna.

Figure 4A:
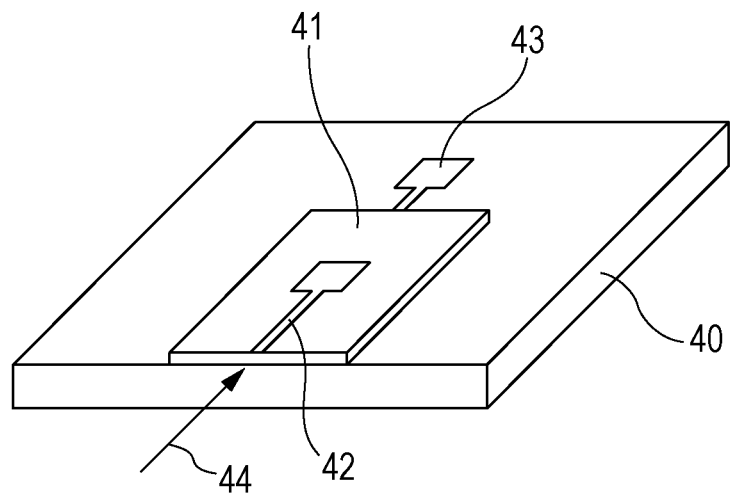
FIGS. 4A and 4B are structure diagrams showing an optical element according to a fourth embodiment of the present invention.
Figure 4B:
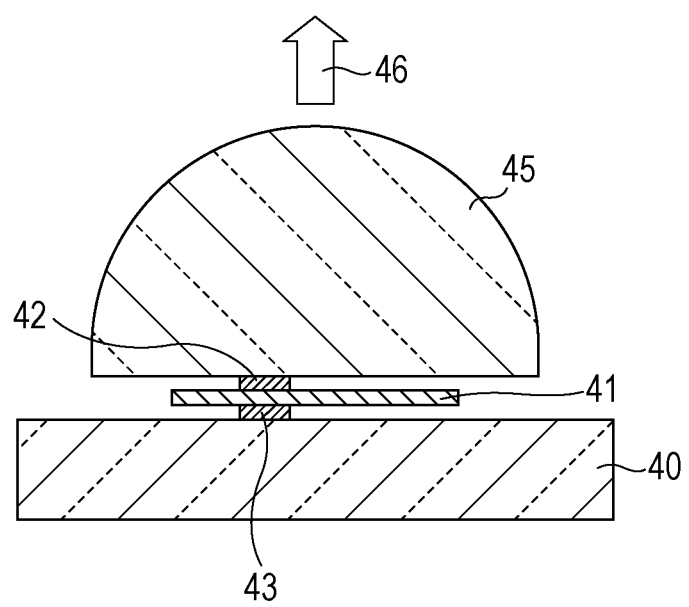

In this embodiment, referring to FIG. 4A, excitation laser light 44 is incident on a side end surface of an end portion of the semiconductor layer 41 arranged between the electrode combined with antenna 42 and the electrode combined with antenna 43. That is, a light irradiation surface that is irradiated with the excitation laser light 44 is located at a junction surface with respect to the electrodes at the end portion of the semiconductor layer 41. If the substrate 40 uses resin such as olefin, since the semiconductor layer 41 has a small light absorptivity and a refractive index higher than the refractive index of the resin substrate 40, the semiconductor layer 41 arranged between the air and the resin functions as a slab waveguide extending along the junction surface with respect to the electrode combined with antenna 42 and the electrode combined with antenna 43. Accordingly, the excitation laser light 44 incident on the side end surface of the semiconductor layer 41 can highly efficiently generate photoelectrons at the Schottky junction while propagating through the slab waveguide. Similarly to the first embodiment, a super hemispherical lens 45 made of high-resistance silicon may be provided to improve the directivity of terahertz waves 46. The other points are similar to those of the first embodiment.

Fifth Embodiment

Figure 5:
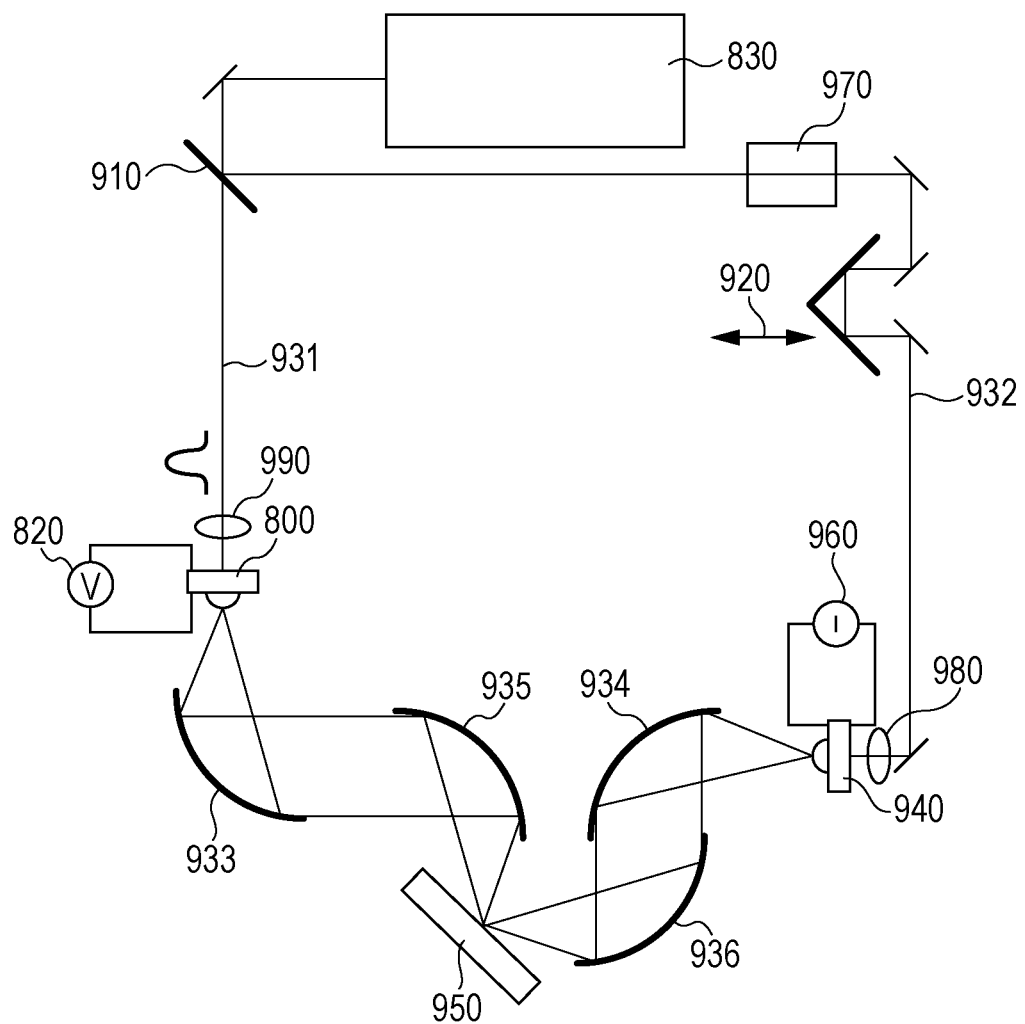
FIG. 5 is a structure diagram showing a spectroscopic apparatus according to a fifth embodiment of the present invention using an optical device according to an embodiment of the present invention.
Figure 6:
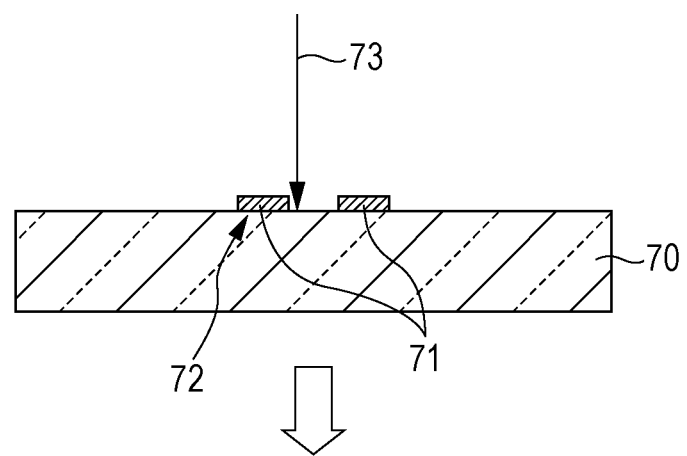
FIG. 6 is a structure diagram showing an optical element of related art.

A fifth embodiment of a terahertz time-domain spectroscopic system (THz-TDS system) will be described with reference to FIG. 5. In this case, a time-domain spectroscopic apparatus is constructed by using, as a terahertz pulse generating unit, an optical device including the optical element according to any of the embodiments of the present invention, a light source, and an optical unit. Such a spectroscopic system is basically the same as a known system. The spectroscopic system includes a short pulse laser 830 serving as a light source, a half mirror 910, an optical delay system 920 serving as a delay unit, an electromagnetic wave generating element 800, and an electromagnetic wave detecting element 940, as major elements. Pumped light 931 and probe light 932 divided by the half mirror 910 are respectively emitted on the electromagnetic wave generating element 800 and the electromagnetic wave detecting element 940 through lenses 990 and 980 serving as optical units. Reference sign 800 is the optical element according to any of the embodiments of the present invention, and forms an electromagnetic wave generating element such that the pumped light 931 passing through the lens 990 is emitted on a light irradiation surface of an electrode having a Schottky junction. The delay unit may be any type of unit as long as the unit can adjust a delay time between generation of terahertz waves by the electromagnetic wave generating element 800 and detection of terahertz waves by the electromagnetic wave detecting element 940.

The terahertz waves generated from the electromagnetic wave generating element 800, to which a voltage is applied from a voltage source 820, are guided to a sample 950 by terahertz wave guides 933 and 935. The terahertz waves containing information such as an absorption spectrum of the sample 950 are guided by the terahertz wave guides 934 and 936 and detected by the electromagnetic wave detecting element 940. In this case, the electromagnetic wave detecting element 940 is a photoconductive element of LT-GaAs of related art. An ammeter 960 connected to the electromagnetic wave detecting element 940 provides a detected current value that is proportional to an amplitude of the detected terahertz waves. To perform time resolution (i.e., to acquire a time waveform of electromagnetic waves), the irradiation timings of the pumped light 931 and probe light 932 may be controlled, for example, by moving the optical delay system 920 that changes the optical path length of the probe light 932.

In this embodiment, the short pulse laser 830 (excitation laser light source) may employ a 1.5-μm-band fiber type femtosecond laser, and the generating element 800 according to this embodiment of the present invention may employ the element in Example 1 in which the Schottky junction defined by semi-insulating InP and Au/Ti is used. Although the number of components in the detection section increases, if a second harmonic wave generator (SHG crystal) 970 is inserted for the probe light 932 and the electromagnetic wave detecting element 940 employs a photoconductive element of low-temperature growth GaAs, the signal-to-noise ratio can be improved. As described above, a terahertz time-domain spectroscopic system can be formed by using the terahertz pulse generating unit, which is the optical device according to the embodiment of the present invention. Alternatively, a time-domain spectroscopic apparatus can be formed by using an optical device including the optical element according to any of the embodiments of the present invention, the light source, and the optical unit, as a terahertz pulse detecting unit.

Example 2

Example 2 corresponding to the fifth embodiment will be described. In this example, a voltage of 20 V is applied to the electromagnetic wave generating element 800 according to the embodiment of the present invention, and ultrashort pulsed light with a pulse width of 30 fsec and a mean power of 20 mW is irradiated from a short pulse laser 830 (fiber laser) with a wavelength of 1.56 μm, as pumped light 931. In the detection section, electric current detected through irradiation with probe light 932 with a power of 5 mW is converted into a voltage signal by a trans impedance amplifier having an amplification factor of about $10^7$ and a band of 10 kHz, and a filter is inserted if necessary. Accordingly, terahertz pulses having a peak around 100 mV are typically observed. By modulating the optical path length of the probe light 932 by the optical delay system 920, the time waveform of the generated terahertz wave pulses can be measured based on the principle of sampling. By performing Fourier transform for the obtained time waveform, a spectrum in a band exceeding 5 THz can be obtained. The driving condition is merely an example, and the application voltage to the electromagnetic wave generating element 800 and the power of the irradiation light are not limited to the above-mentioned values. Alternatively, the application voltage to the electromagnetic wave generating element 800 may be modulated with 10 kHz, or the light intensity may be modulated by using an optical chopper, and a signal may be detected through detection with a lock-in amplifier.

Sixth Embodiment

The optical element according to any of the embodiments of the present invention is described as the terahertz wave generating element. However, the optical element may be used as a detecting element. The detecting element may have the same configuration as the configuration shown in FIG. 1A or 1B referenced when the first embodiment is described. The propagation direction of the terahertz waves 7 is aimed at the element. The principal of detection for terahertz waves is as follows. Electrons that acquire an energy through irradiation with the excitation light 6 cross the barrier generated due to the electric field of the input terahertz waves 7, and run through the semiconductor layer 2. Accordingly, electric current flows between the electrodes, and by detecting the electric current, the electric field intensity of terahertz waves can be detected. In this case, the terahertz waves 7 are coupled to the electrode combined with antenna 3 and efficiently acquired. The excitation light 6 efficiently applies an energy to the electrons.

Namely, photoelectrons are excited at timing when the light irradiation surface is irradiated with the light 6. If the electric field due to the terahertz waves 7 is applied, the energy band structure as shown in FIG. 2B is obtained depending on the polarity. Accordingly, since the photoelectrons flow, the electric field due to the terahertz waves 7 can be detected. However, the configuration is not bipolar unlike the photoconductive element. When the output waveform is analyzed, correction with data, such as a previously obtained calibration curve, is necessary.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-044838 filed Mar. 2, 2010, which is hereby incorporated by reference herein in its entirety.

What is claimed is:

1. An optical device arranged to generate or detect a terahertz wave, the optical device comprising:
   a laser light source configured to output light;
   an optical element configured to generate or detect the terahertz wave when the optical element is irradiated with the light; and
   an optical unit configured to direct the light from the laser light source to the optical element,
   wherein the optical element includes:
   a semiconductor layer; and
   a plurality of electrodes formed in electrical contact with the semiconductor layer and including an antenna configured to couple the terahertz wave and a space,
   wherein at least one of the electrodes forms a Schottky junction between the one electrode and the semiconductor layer;
   wherein the laser light source outputs the light whose photon energy is larger than a barrier height of the Schottky junction and smaller than an energy band gap of the semiconductor layer; and
   wherein the optical unit is arranged to irradiate the Schottky junction with the light through a surface of the semiconductor layer without the electrodes.

2. The optical element according to claim 1, wherein the Schottky junction is disposed at an end portion of the semiconductor layer and defines part of a waveguide for the light, the waveguide extending along a surface of the junction.

3. The optical element according to claim 1, wherein the semiconductor layer is an epitaxial layer obtained by removing a growth substrate of an epitaxial layer and transferring the removed portion onto another substrate.

4. A terahertz time-domain spectroscopic apparatus comprising:
   a generating unit arranged to generate a terahertz wave;
   a detecting unit arranged to detect the terahertz wave that is radiated from the generating unit, is emitted on a sample, and reaches the detecting unit; and
   a delay unit arranged to adjust a delay time between the generation of the terahertz wave by the generating unit and the detection of the terahertz wave by the detecting unit,
   wherein at least one of the generating unit and the detecting unit is the optical device according to claim 1.

5. The optical device according to claim 1, wherein the light reaches the Schottky junction after transmitting through the semiconductor layer having the energy band gap larger than the photon energy of the light.

6. The optical device according to claim 5, wherein the light reaches the Schottky junction after transmitting through only the semiconductor layer.

7. The optical device according to claim 6,
   wherein the optical element further includes a substrate being in contact with the semiconductor layer, and
   wherein the substrate includes a hole through which the light passes.

8. The optical device according to claim 1,
   wherein the optical element further includes a substrate being in contact with the semiconductor layer, and
   wherein the light reaches the Schottky junction after transmitting through the semiconductor layer having the energy band gap larger than the photon energy of the light and the substrate having a wavelength dispersion smaller than a wavelength dispersion of the semiconductor layer in a wavelength band of the light.

9. The optical device according to claim 8,
   wherein the light reaches the Schottky junction after transmitting through only the semiconductor layer and the substrate.

10. The optical device according to claim 1,
    wherein the optical element further includes a substrate being in contact with the semiconductor layer, and
    wherein the substrate includes a hole through which the light passes.

* * * * *